United States Patent
Yang

(10) Patent No.: US 12,191,809 B2
(45) Date of Patent: Jan. 7, 2025

(54) VOLTAGE MODE CONTROLLED LINEAR FREQUENCY MODULATION OSCILLATOR

(71) Applicant: ELITE SEMICONDUCTOR MICROELECTRONICS TECHNOLOGY INC., Hsinchu (TW)

(72) Inventor: Yao-Wei Yang, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 41 days.

(21) Appl. No.: 18/326,034

(22) Filed: May 31, 2023

(65) Prior Publication Data

US 2024/0405719 A1    Dec. 5, 2024

(51) Int. Cl.
| | | |
|---|---|---|
| *H03K 3/0231* | (2006.01) | |
| *H03B 5/04* | (2006.01) | |
| *H03B 5/12* | (2006.01) | |
| *H03K 7/06* | (2006.01) | |

(52) U.S. Cl.
CPC .............. *H03B 5/1228* (2013.01); *H03B 5/04* (2013.01); *H03K 3/0231* (2013.01); *H03K 7/06* (2013.01)

(58) Field of Classification Search
CPC .......... H03B 5/04; H03K 3/0231; H03K 4/50; H03K 7/06
See application file for complete search history.

(56) References Cited

U.S. PATENT DOCUMENTS

| | | | |
|---|---|---|---|
| 10,256,722 B1 * | 4/2019 | Yang | H02M 3/156 |
| 11,271,479 B2 | 3/2022 | Mei | |
| 2014/0062610 A1 * | 3/2014 | Ito | H03K 3/0231 |
| | | | 331/186 |
| 2018/0351509 A1 * | 12/2018 | Zhang | H03B 5/04 |
| 2019/0386615 A1 * | 12/2019 | Kim | H03K 5/135 |

* cited by examiner

*Primary Examiner* — Levi Gannon

(57) ABSTRACT

A voltage mode controlled linear frequency modulation oscillator comprises a voltage modulation circuit, a reference current generating circuit, and an oscillating circuit. The voltage modulation circuit is configured to generate a modulation voltage according to a feedback voltage and a first reference voltage. The reference current generating circuit, coupled to the voltage modulation circuit, is configured to generate a first reference current according to the modulation voltage and a second reference voltage. The oscillating circuit, coupled to the reference current generating circuit, is configured to generate an oscillating signal with an oscillating frequency according to the first reference current, wherein the oscillating frequency varies with the modulation voltage.

10 Claims, 3 Drawing Sheets

VOLTAGE MODE CONTROLLED LINEAR FREQUENCY MODULATION OSCILLATOR

BACKGROUND OF THE INVENTION

1. Field of the Invention

The present disclosure relates to an oscillator, and in particular to a voltage mode controlled linear frequency modulation oscillator.

2. Description of the Related Art

An output voltage is rather low when a buck converter is initially activated, such that an inductor current may have a large slope and a current detection circuit thus needs time to detect and represent the inductor current. Thus, when an inductor current operates at a high frequency and has a large slope, it is difficult to control such inductor current.

In order to provide a sense control circuit with a high accuracy and to efficiently control an inductor current, a buck converter inhibits changes in an inductor current and an output voltage by means of modulating the frequency of an oscillator. Moreover, when a short circuit occurs at an output terminal of a typical direct-current-to-direct-current (DC/DC) converter such as a buck converter, the output terminal is shorted to ground or a low power voltage. A large voltage difference taking place between an input terminal and an output terminal may cause a strong current to pass through an inductor of the DC/DC converter, resulting in circuit damage or problems of malfunction of back-end circuits.

In order to alleviate an inductor current when a voltage level between an output terminal and an input terminal is relatively large, the frequency of an oscillation signal generated by an oscillator of the DC/DC converter needs to be modulated. By means of frequency modulation, a sense control circuit is able to accurately sense an inductor current signal, furthermore accurately controlling the size of the inductor current. Common schemes for achieving the above include frequency hopping modulation and linear frequency modulation.

BRIEF SUMMARY OF THE INVENTION

In a conventional linear frequency modulation scheme, a current mode can be adopted to improve the frequency of an oscillator so as to inhibit changes in an inductor current and an output voltage. However, in the method above, an oscillator may become inoperable when a modulation current is too small, leading to risks of possible malfunction of the oscillator.

In view of the prior art above, the present invention provides a voltage mode controlled linear frequency modulation oscillator to overcome the problems encountered by the current mode linear frequency modulation scheme.

To achieve the above and other objects, the present disclosure provides a voltage mode controlled linear frequency modulation oscillator, including a voltage modulation circuit, a reference current generation circuit, and an oscillation circuit. The voltage modulation circuit is configured to generate a modulation voltage according to a feedback voltage and a first reference voltage. An input of the reference current generation circuit, coupled to the output of the voltage modulation circuit, is configured to generate a first reference current according to the modulation voltage and a second reference voltage. An input to the oscillation circuit, coupled to an output of the reference current generation circuit, is configured to generate an oscillation signal having an oscillation frequency according to the first reference current, wherein the oscillation frequency varies with the modulation voltage.

In an embodiment, an initial value of the oscillation frequency is determined according to the first reference voltage.

In an embodiment, the voltage modulation circuit includes: a first transistor, coupled to a high voltage source; a second transistor, respectively coupled to the first transistor and the high voltage source; a current source, respectively coupled to the second transistor and the high voltage source and generating a current; a third transistor, respectively coupled to the first transistor and the second transistor; an error amplifier, respectively coupled to a feedback voltage and the third transistor; a first resistor, respectively coupled to the error amplifier and the third transistor; a second resistor, coupled to the current source which generates a first reference voltage when the current passes through the second resistor; and an activation switch circuit, positioned between ground and the first resistor and the second resistor and controlled by an enable signal to connect or disconnect a path between the first resistor, the second resistor, and ground.

In an embodiment, the modulation voltage is equal to the high voltage source when the activation switch circuit is turned off.

In an embodiment, a ratio of the first transistor to the second transistor is 1:k, and a ratio of the first resistor to the second resistor is 1:n, where k and n are positive numbers and are not equal to each other.

In an embodiment, the modulation voltage is equal to a sum of the first reference voltage and a set voltage when the activation switch circuit is turned on.

In an embodiment, the set voltage is k*n*feedback voltage.

In an embodiment, the reference current generation circuit includes: a fourth transistor, coupled to the high voltage source; a fifth transistor, respectively coupled to the high voltage source and the fourth transistor; a sixth transistor, respectively coupled to the fourth transistor and the fifth transistor; an error amplifier, respectively coupled to the modulation voltage, the second reference voltage, and the sixth transistor and configured to generate an error amplification signal to the sixth transistor according to the modulation voltage and the second reference voltage; and a third resistor, respectively coupled to the error amplifier and the sixth transistor and generating an end voltage when a second reference current passes through the third resistor.

In an embodiment, the second reference current passes through the third resistor when the fourth transistor and the sixth transistor are turned on.

In an embodiment, the end voltage follows a voltage value of the second reference voltage when the modulation voltage is greater than the second reference voltage.

In an embodiment, the end voltage follows a voltage value of the modulation voltage when the modulation voltage is less than the second reference voltage.

Thus, the voltage mode controlled linear frequency modulation oscillator of the present disclosure enables a buck converter to output a voltage smoother than that of a frequency hopping scheme when the buck converter is initially started. In a situation with a low output voltage, the oscillator of the voltage mode controlled linear frequency modulation oscillator of the present disclosure is capable of effectively inhibiting the occurrence of a large inductor current. Moreover, the voltage mode controlled linear frequency modulation oscillator of the present disclosure is free from the problem of possible malfunction of the oscillator caused by an overly small current.

DETAILED DESCRIPTION OF THE INVENTION

To facilitate understanding of the objectives, characteristics, and effects of this present disclosure, embodiments together with the attached drawings for the detailed description of the present disclosure are provided.

Figure 1:
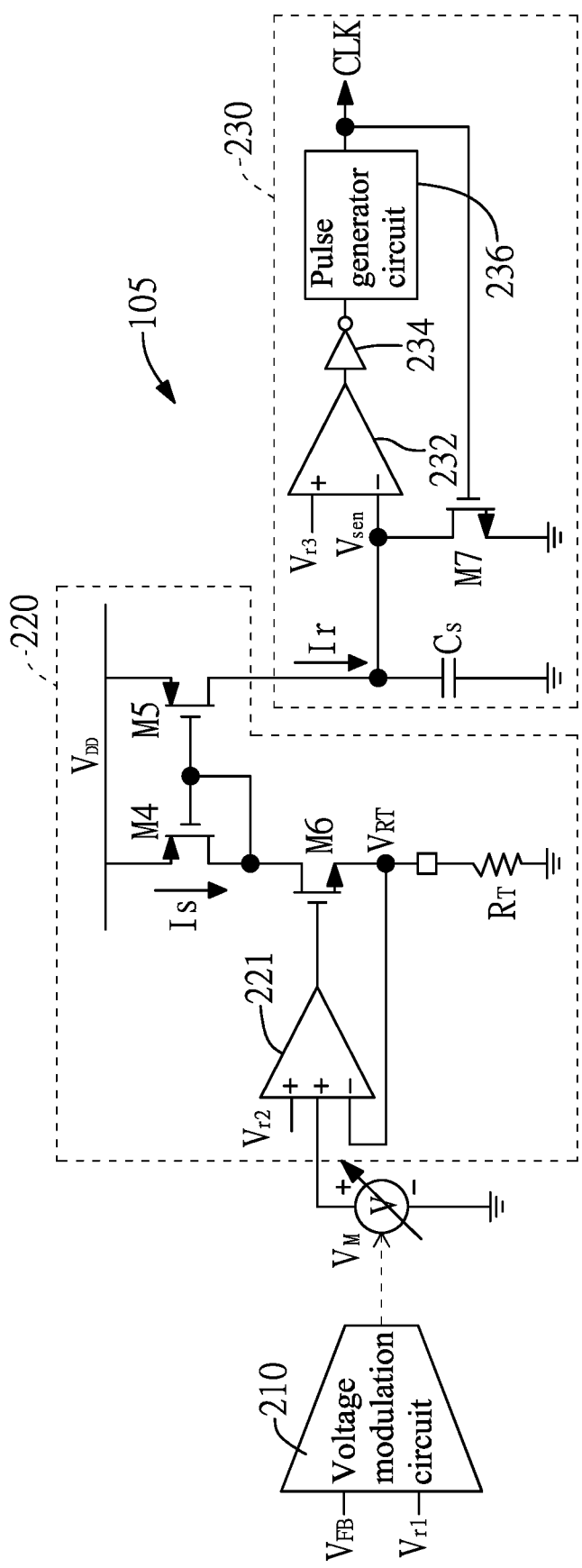
FIG. 1 is a schematic diagram of an oscillator according to an embodiment of the present disclosure.

Refer to FIG. 1, which is a schematic diagram of an oscillator according to an embodiment of the present disclosure. As shown in FIG. 1, an oscillator 105 includes a voltage modulation circuit 210, a reference current generation circuit 220, and an oscillation circuit 230.

The voltage modulation circuit 210 is configured to generate a modulation voltage $V_M$ and provide the modulation voltage $V_M$ to the reference current generation circuit 220 according to a feedback voltage $V_{FB}$ and a first reference voltage $V_{r1}$. A first input terminal of the voltage modulation circuit 210 is coupled to the feedback voltage $V_{FB}$. A second input terminal of the voltage modulation circuit 210 is coupled to the first reference voltage $V_{r1}$. An output terminal of the voltage modulation circuit 210 is coupled to the reference current generation circuit 220.

The reference current generation circuit 220 is coupled to the voltage modulation circuit 210. The reference current generation circuit 220 is configured to generate a first reference current Ir according to the modulation voltage $V_M$ and a second reference voltage $V_{r2}$.

The reference current generation circuit 220 includes an error amplifier 221, a fourth transistor M4, a fifth transistor M5, a sixth transistor M6 and a third resistor $R_T$. A first input terminal of the error amplifier 221 is coupled to the second reference voltage $V_{r2}$. A second input terminal of the error amplifier 221 is coupled to the modulation voltage $V_M$. A third input terminal of the error amplifier 221 is coupled to one end of the third resistor $R_T$. Another end of the third resistor $R_T$ is coupled to ground. An output terminal of the error amplifier 221 is coupled to a gate of the sixth transistor M6. A source of the fourth transistor M4 is coupled to a high voltage source $V_{DD}$, and a gate of the fourth transistor M4 is respectively coupled to a drain of the fourth transistor M4 and a gate of the fifth transistor M5. A source of the fifth transistor M5 is coupled to the high voltage source $V_{DD}$, and a drain of the fifth transistor M5 is respectively coupled to a comparator 232 and an oscillation capacitor Cs of the oscillation circuit 230. A drain of the sixth transistor M6 is coupled to a drain of the fourth transistor M4. The source of the sixth transistor M6 is coupled to one end of the third resistor $R_T$.

The oscillation circuit 230 is coupled to the reference current generation circuit 220. The oscillation circuit 230 is configured to generate an oscillation signal CLK having an oscillation frequency according to the first reference current Ir, wherein the oscillation frequency varies according to the modulation voltage $V_M$.

The oscillation circuit 230 includes the comparator 232, an inverter 234, a pulse generator circuit 236, a seventh transistor M7, and the oscillation capacitor Cs. A first input terminal of the comparator 232 is coupled to a third reference voltage $V_{r3}$. A second input terminal of the comparator 232 is respectively coupled to the oscillation capacitor Cs and a drain of the seventh transistor M7. An output terminal of the comparator 232 is coupled to an input terminal of the inverter 234. An output terminal of the inverter 234 is coupled to an input terminal of the pulse generator circuit 236. An output terminal of the pulse generator circuit 236 is coupled to a gate of the seventh transistor M7 and the output terminal of the pulse generator circuit 236 outputs the oscillation signal CLK. The source of the seventh transistor M7 is coupled to ground. In an embodiment, the fourth transistor M4 and the fifth transistor M5 are implemented by P-type metal oxide semiconductor field-effect transistors (MOSFETs), and the sixth transistor M6 and the seventh transistor M7 are implemented by N-type MOSFETs.

As described above, when a voltage level between an input voltage and an output voltage is large and a voltage converter has not yet reached a stable state, drastic changes in an inductor current are inhibited by means of frequency modulation. In a buck converter, when an output voltage has not yet reached a set voltage, frequency modulation is more necessary when an output voltage is too small (meaning that the feedback voltage $V_{FB}$ is relatively small). The voltage modulation circuit 210 modulates the feedback voltage $V_{FB}$ and the first reference voltage $V_{r1}$ so as to adjust the output modulation voltage $V_M$ to an error amplifier 221. When the modulation voltage $V_M$ is less than second reference voltage $V_{r2}$, linear frequency modulation control begins.

The error amplifier 221 outputs an error amplification signal to the gate of the sixth transistor M6 according to the modulation voltage $V_M$ and the second reference voltage $V_{r2}$, and controls and modulates the sixth transistor M6 such that the end voltage $V_{RT}$ follows the modulation voltage $V_M$ or the second reference voltage $V_{r2}$. The second reference current Is passes through the third resistor $R_T$ when the fourth transistor M4 and the sixth transistor M6 are turned on, so as to generate the end voltage $V_{RT}$. When the modulation voltage $V_M$ is greater than the second reference voltage $V_{r2}$, the end voltage $V_{RT}$ follows a voltage value of the second reference voltage $V_{r2}$, such that the oscillation signal CLK output by the pulse generator circuit 236 reaches a set final frequency. When the modulation voltage $V_M$ is less than the second reference voltage $V_{r2}$, the end voltage $V_{RT}$ follows a voltage value of the modulation voltage $V_M$, such that the oscillation frequency of the oscillation signal CLK output by the pulse generator circuit 236 is lower than the set final frequency.

The fourth transistor M4 and the fifth transistor M5 form a current mirror, and the second reference current Is is mapped to the first reference current Ir. The first reference current Ir passes through the oscillation capacitor Cs so as to perform charging and generate a voltage $V_{sen}$. The comparator 232 outputs a comparison signal to the inverter 234 according to the third reference voltage $V_{r3}$ and the voltage $V_{sen}$. The inverter 234 outputs an inverted signal to the pulse generator circuit 236 according to the comparison signal. The pulse generator circuit 236 outputs the oscillation signal CLK according to the inverted signal.

A current value of the first reference current Ir is affected by the second reference current Is. A current value of the second reference current Is is affected by the error amplifier 221, the sixth transistor M6, and the third resistor $R_T$. As the first reference current Ir increases, the oscillation signal Cs charges at a faster speed, and the oscillation frequency of the oscillation signal CLK output by the pulse generator circuit 236 becomes faster. Conversely, as the first reference current Ir decreases, the oscillation signal Cs charges at a slower speed, and the oscillation frequency of the oscillation signal CLK output by the pulse generator circuit 236 becomes slower. Moreover, an initial value of the oscillation frequency is determined according to the first reference voltage $V_{r1}$.

Figure 2:
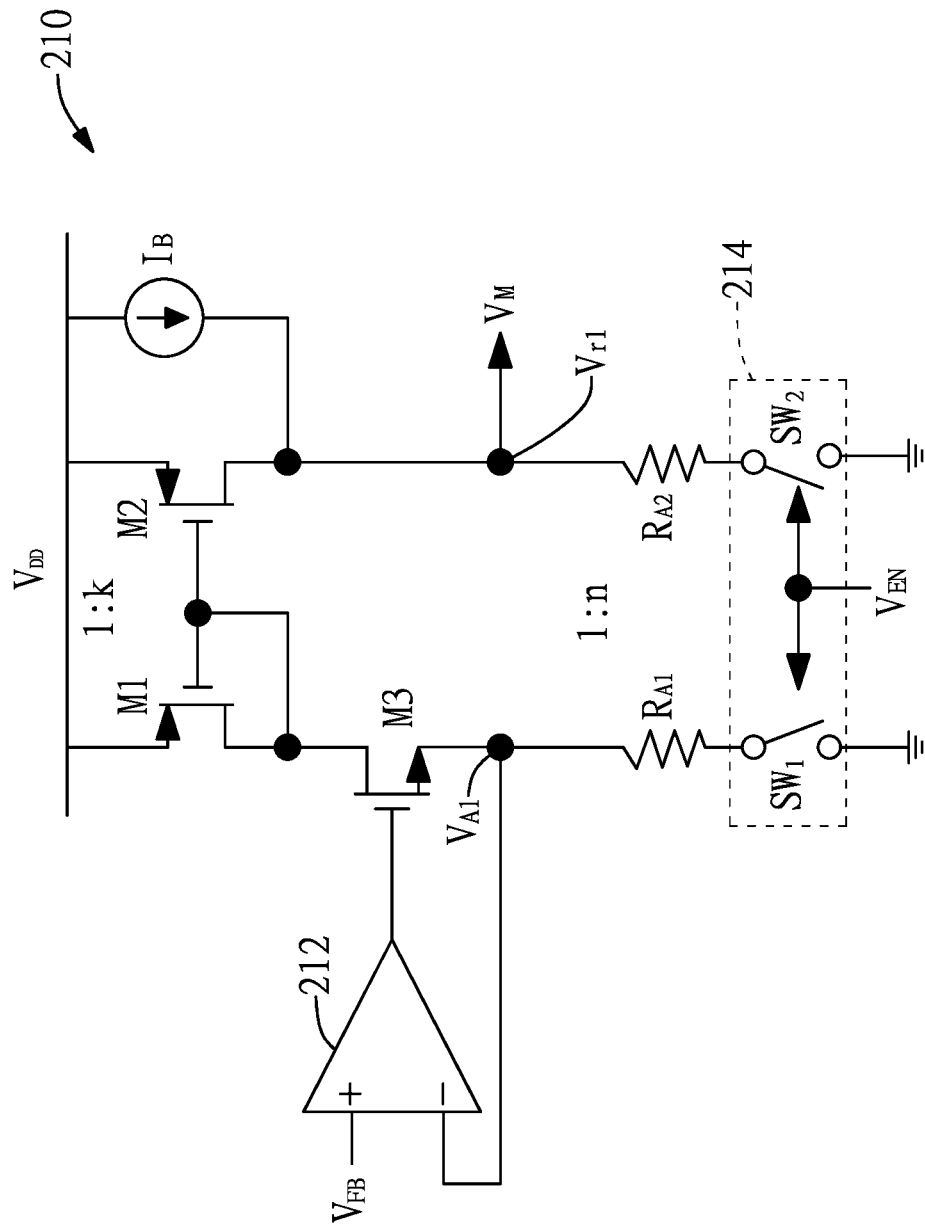
FIG. 2 is a schematic diagram of a voltage modulation circuit according to an embodiment of the present disclosure.

Refer to FIG. 2 showing a schematic diagram of a voltage modulation circuit according to an embodiment of the present disclosure. As shown in FIG. 2, the voltage modulation circuit 210 includes an error amplifier 212, a first transistor M1, a second transistor M2, a third transistor M3, a current source $I_B$, a first resistor $R_{A1}$, a second resistor $R_{A2}$, and an activation switch circuit 214.

A first input terminal of the error amplifier 212 is coupled to the feedback voltage $V_{FB}$. A second input terminal of the error amplifier 212 is coupled to the source of the third transistor M3. An output terminal of the error amplifier 212 is coupled to the gate of the third transistor M3.

A source of the first transistor M1 is coupled to a high voltage source $V_{DD}$, and a gate of the first transistor M1 is respectively coupled to a drain of the first transistor M1 and a gate of the second transistor M2. A source of the second transistor M2 is coupled to the high voltage source $V_{DD}$. One end of the current source $I_B$ is coupled to the high voltage source $V_{DD}$. Another end of the current source $I_B$ is coupled to a drain of the second transistor M2. A drain of the third transistor M3 is respectively coupled to the gates of the first transistor M1 and the second transistor M2. In an embodiment, the first transistor M1 and the second transistor M2 are implemented by P-type MOSFETs, and the third transistor M3 is implemented by an N-type MOSFET.

One end of the first resistor $R_{A1}$ is coupled to a source of the third transistor M3. Another end of the first resistor $R_{A1}$ is coupled to one end of the activation switch circuit 214, and another end of the activation switch circuit 214 is coupled to ground. One end of the second resistor $R_{A2}$ is coupled to the drain of the second transistor M2 and one end of the current source $I_B$. Another end of the second resistor $R_{A2}$ is coupled to one end of the activation switch circuit 214, and another end of the activation switch circuit 214 is coupled to ground. In other words, the activation switch circuit 214 is positioned between the ground and the first resistor $R_{A1}$ and the second resistor $R_{A2}$, and is controlled by an enable signal $V_{EN}$ to connect or disconnect a path between the first resistor $R_{A1}$ and ground, and the second resistor $R_{A2}$ and ground. The activation switch circuit 214 consists of a first switch $SW_1$ and a second switch $SW_2$.

When the enable signal $V_{EN}$ controls and turns on the activation switch circuit 214, the voltage modulation circuit 210 starts to perform linear frequency modulation control. A voltage value of a node voltage $V_{A1}$ is modulated to approximate the feedback voltage $V_{FB}$. The first reference voltage $V_{r1}$ is the current source $I_B$ multiplied by the second resistor $R_{A2}$. In other words, the first reference voltage $V_{r1}$ is generated when the current source $I_B$ passes through the second resistor $R_{A2}$. The modulation voltage $V_M$ is $V_M = V_{r1} + k*n*V_{FB}$, and since the feedback voltage $V_{FB}$ approximates the node voltage $V_{A1}$, the modulation voltage $V_M$ is $V_M = V_{r1} + k*n*V_{A1}$. In other words, the modulation voltage $V_M$ is equal to a sum of the first reference voltage $V_{r1}$ and the set voltage, wherein the set voltage is $k*n*$node voltage $V_{A1}$, or the set voltage is $k*n*$feedback voltage $V_{FB}$. Wherein, a ratio of the first transistor M1 to the second transistor M2 is 1:k, and a ratio of the first resistor $R_{A1}$ to the second resistor $R_{A2}$ is 1:n, where k and n are positive numbers and are not equal to each other. For example, the ratio of the first transistor M1 to the second transistor M2 is 1:2.5, and the ratio of the first resistor $R_{A1}$ to the second resistor $R_{A2}$ is 1:1. Moreover, when the enable signal $V_{EN}$ controls and turns off the activation switch circuit 214, the modulation voltage $V_M$ is equal to the high voltage source $V_{DD}$.

Figure 3:
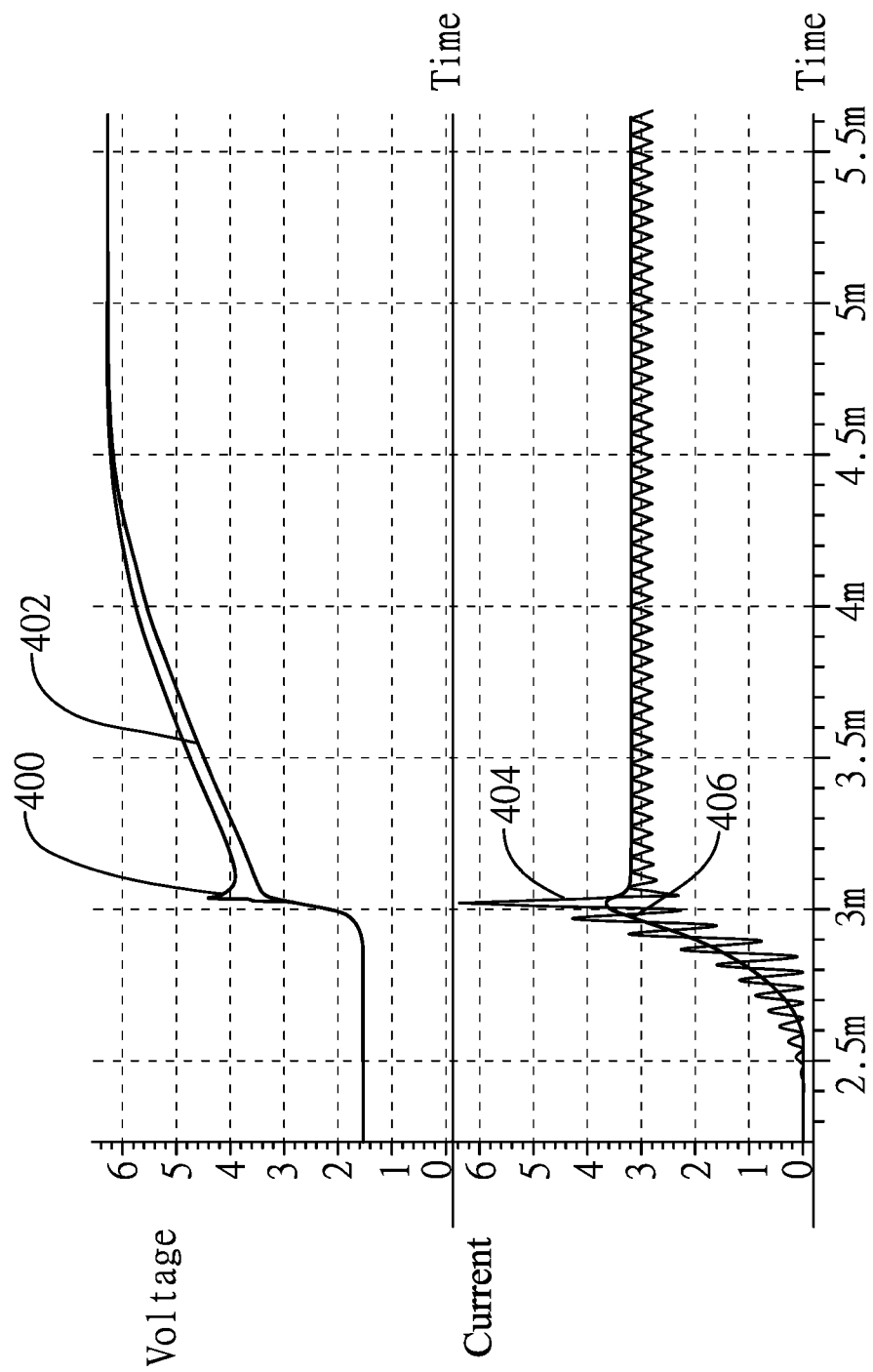
FIG. 3 is a graph illustrating a comparison of an output voltage and an inductor current between the present disclosure and the prior art.

Refer to FIG. 3, which is a graph illustrating a comparison of an output voltage and an inductor current between the present disclosure and the prior art. As shown in FIG. 3, the horizontal axis represents time, the upper vertical axis represents voltage, and the lower vertical axis represents current. A curve 400 represents an output voltage when a frequency hopping modulation scheme of the prior art is adopted. A curve 402 represents an output voltage when the linear modulation scheme according to an embodiment of the present disclosure is adopted. It can be seen that, between the time 3 ms and 3.2 ms, the output voltage provided by the linear modulation scheme according to an embodiment of the present disclosure is free from any sudden or huge voltage bounces.

A curve 404 represents an inductor current when a frequency hopping modulation scheme of the prior art is adopted. A curve 406 represents an inductor current when the linear modulation scheme according to an embodiment of the present disclosure is adopted. It can be seen that, between the time 3 ms and 3.2 ms, the inductor current provided by the linear modulation scheme according to an embodiment of the present disclosure is inhibited within a certain range, so as to prevent circuit damage or the problem of malfunction of back-end circuits.

In conclusion, the voltage mode controlled linear frequency modulation oscillator of the present disclosure enables a buck converter to output a voltage smoother than that of a frequency hopping scheme during an initial start. In a situation with a low output voltage, the oscillator of the voltage mode controlled linear frequency modulation oscillator of the present disclosure is capable of effectively inhibiting the occurrence of a large inductor current. Moreover, the voltage mode controlled linear frequency modulation oscillator of the present disclosure is free from the problem of possible malfunction of the oscillator caused by an overly small current.

The present invention is described by way of the preferred embodiments above. A person skilled in the art should understand that, these embodiments are merely for describing the present invention are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A voltage mode controlled linear frequency modulation oscillator, comprising:
   a voltage modulation circuit, configured to generate a modulation voltage according to a feedback voltage and a first reference voltage;
   a reference current generation circuit, coupled to the voltage modulation circuit, configured to generate a first reference current according to the modulation voltage and a second reference voltage; and an oscillation circuit, coupled to the reference current generation circuit, configured to generate an oscillation signal having an oscillation frequency according to the first reference current, wherein the oscillation frequency varies with the modulation voltage, wherein the voltage modulation circuit comprises:
- a first transistor, coupled to a high voltage source;
- a second transistor, respectively coupled to the first transistor and the high voltage source;
- a current source, respectively coupled to the second transistor and the high voltage source and generates a current;
- a third transistor, respectfully coupled to the first transistor and the second transistor;
- an error amplifier, respectively coupled to the feedback voltage and the third transistor;
- a first resistor, respectively coupled to the error amplifier and the third transistor;
- a second resistor, coupled to the current source and generating the first reference voltage when the current passes through the second resistor; and
- an activation switch circuit, positioned between ground and the first resistor and ground and the second resistor and controlled by an enable signal to connect or disconnect a path between the first resistor and ground and the second resistor and ground.

2. The voltage mode controlled linear frequency modulation oscillation according to claim 1, wherein an initial value of the oscillation frequency is determined according to the first reference voltage.

3. The voltage mode controlled linear frequency modulation oscillation according to claim 1, wherein the modulation voltage is equal to the high voltage source when the activation switch circuit is turned off.

4. The voltage mode controlled linear frequency modulation 3 to claim 1, wherein a ratio of the first transistor to the second transistor is 1:k, and a ratio of the first resistor to the second resistor is 1:n, where k and n are positive numbers and are not equal to each other.

5. The voltage mode controlled linear frequency modulation oscillation according to claim 4, wherein the modulation voltage is equal to a sum of the first reference voltage and a set voltage when the activation switch circuit is turned on.

6. The voltage mode controlled linear frequency modulation oscillation according to claim 5, wherein the set voltage equals k*n*the feedback voltage.

7. The voltage mode controlled linear frequency modulation oscillation according to claim 1, wherein the reference current generation circuit comprises:
- a fourth transistor, coupled to the high voltage source;
- a fifth transistor, respectively coupled to the high voltage source and the fourth transistor;
- a sixth transistor, respectively coupled to the fourth transistor and the fifth transistor;
- an error amplifier, respectively coupled to the modulation voltage, the second reference voltage, and the sixth transistor and configured to generate an error amplification signal to the sixth transistor according to the modulation voltage and the second reference voltage; and
- a third resistor, respectively coupled to the error amplifier and the sixth transistor and generates an end voltage when a second reference current passes through the third resistor.

8. The voltage mode controlled linear frequency modulation oscillation according to claim 7, wherein the second reference current passes through the third resistor when the fourth transistor and the sixth transistor are turned on.

9. The voltage mode controlled linear frequency modulation oscillation according to claim 7, wherein the end voltage follows a voltage value of the second reference voltage when the modulation voltage is greater than the second reference voltage.

10. The voltage mode controlled linear frequency modulation oscillation according to claim 7, wherein the end voltage follows a voltage value of the modulation voltage when the modulation voltage is less than the second reference voltage.

* * * * *